(12) United States Patent
Shiga et al.

(10) Patent No.: US 7,650,584 B2
(45) Date of Patent: Jan. 19, 2010

(54) APPLICATION SPECIFIC SEMICONDUCTOR INTEGRATED CIRCUIT AND ITS MANUFACTURING METHOD THEREOF

(75) Inventors: Hitoshi Shiga, Yokohama (JP); Kiyofumi Sakurai, Yokohama (JP); Kenji Mima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 11/838,605

(22) Filed: Aug. 14, 2007

(65) Prior Publication Data
US 2008/0074929 A1    Mar. 27, 2008

(30) Foreign Application Priority Data
Sep. 22, 2006    (JP) .............................. 2006-257257

(51) Int. Cl.
G06F 17/50    (2006.01)
G06F 9/45    (2006.01)

(52) U.S. Cl. ................... 716/10; 716/1; 716/8; 716/12; 716/13; 716/14; 365/185.01; 365/185.05; 365/185.17

(58) Field of Classification Search .............. 716/1, 716/8, 12–14; 365/185.01, 185.05, 185.17
See application file for complete search history.

(56) References Cited

U.S. PATENT DOCUMENTS

| 6,505,332 B1 * | 1/2003 | Oda .............................. 716/12 |
| 6,591,406 B2 * | 7/2003 | Ishikawa ........................ 716/8 |
| 6,763,511 B2 * | 7/2004 | Banno et al. ................... 716/12 |
| 6,826,742 B2 | 11/2004 | Maeno et al. |
| 7,061,112 B2 | 6/2006 | Takao |

FOREIGN PATENT DOCUMENTS

JP    2001-85614    3/2001

* cited by examiner

*Primary Examiner*—Vuthe Siek
*Assistant Examiner*—Nghia M Doan
(74) *Attorney, Agent, or Firm*—Oblon, Spivak, McClelland, Maier & Neustadt, L.L.P.

(57) ABSTRACT

An ASIC includes a first-wire extended in a first-direction and a second-wire extended in a parallel direction to the first-wire and both are placed on a first-wire layer; and a third-wire placed on a second-wire layer above the first-wire layer and is extended above the wire and above the second-wire in a second-direction which intersects the first-direction and passing through a first via-hole is connected to the first-wire, and a fourth-wire separated from the third-wire extended in a parallel direction above the first-wire and above the second-wire and a fifth-wire separated from both the third-wire and the fourth-wire and extended in a parallel direction in a smallest space and passing through a second via-hole is connected to the second-wire, wherein, one end of the fifth-wire is extended to the center between the second-wire and the first-wire from above the second-wire.

13 Claims, 5 Drawing Sheets

APPLICATION SPECIFIC SEMICONDUCTOR INTEGRATED CIRCUIT AND ITS MANUFACTURING METHOD THEREOF

CROSS REFERENCE TO RELATED APPLICATION

This application is based upon and claims the benefit of priority from the prior Japanese Patent Application No. 2006-257257, filed on Sep. 22, 2006; the entire contents of which are incorporated herein by reference.

BACKGROUND OF THE INVENTION

1. Field of the Invention

This invention is related to an application specific semiconductor integrated circuit (ASIC) and its manufacturing method thereof, and in particular is related to an application specific semiconductor integrated circuit which uses an automatic placement and routing system which automatically places a wire as well as a via-hole which connects circuits using a computer, and its manufacturing methods.

2. Description of the Related Art

An application specific semiconductor integrated circuit is a semiconductor device which is best suited to a high mix low volume production. In the application specific semiconductor integrated circuit, an automatic placement and routing system using a computer, is used in the placement of wires which carry out wire connection and the placement of a via-hole which connects upper and lower wires within the placement of a circuits (function block) such as a logical circuit or memory circuit manufactured by a floor plan.

Recently, as the miniaturization of line and space, which refers to the relationship between the width of wires and the interval between wires, as well as the miniaturization of the semiconductor elements which make up a circuit, progresses, there is a tendency for design rules which are handled in an automatic placement and routing system to become more complex. For example, there is a tendency for a multi-space rule in which an adjacent wire interval changes in accordance with a wire width, or a contact overlay margin rule in which the size of the contact overlay margin area around a via-hole changes in accordance with a wire width, are to be included as new rules.

These rules which are included in design rules are important rules when actually manufacturing an application specific semiconductor integrated circuit using a production mask which is made for use in production from mask data which is produced based upon an automatic placement and routing system. A wire which is automatically placed using an algorithm of an automatic placement and routing system is placed in high density (dense) in the central part of an application specific semiconductor integrated circuit and in low density (non-dense) in the surrounding part. In the manufacture of an actual application specific integrated circuit, an aluminum alloy film, for example, is used in a wire, and this aluminum alloy film is patterned by etching and using a photo-mask which is produced by photo lithography technology after the film is formed by a spattering method. If the density of the wires is different a change occurs in the wrap-around of the development solution when a photo-mask is manufactured and in the etching solution when patterning the aluminum alloy film. Usually, the width of a wire which is placed in the part where wire density is high increases because the wrap-around of the developing solution or etching solution is insufficient. However, the width of a wire which is placed in the part where wire density is low decreases because the darting of the developing solution or etching solution is sufficiently carried out.

The multi space rule is a rule in which a wire interval between a wire with a large width and an adjacent wire is increased and a wire interval between a wire with a small width and an adjacent wire is reduced in order to resolve defects during this type of manufacture process. Alternatively, the contact overlay margin rule is a rule in which the wire width around a via-hole of a wire in which poor conduction can easily occur is increased in the case where an adjacent wire interval is wide.

Further, this kind of application specific semiconductor integrated circuit and its manufacturing methods are disclosed in, for example, Japanese Patent Laid-Open Publication No. 2001-85614.

However, in the application specific semiconductor integrated circuit and its manufacturing methods previously stated, the following points were not considered. In an automatic placement and routing system the multi-space rule fixes the wire width and wire interval and the contact overlay margin rule fixes the contact overlay margin size around the via-hole of the wire. It is preferred that uniform design rules are adopted. However, in whichever wire placement pattern or via-hole placement pattern, in the case where a design rule is selected so that a deign rule check (DRC) error does not occur, the wire layout area after wire placement increases and because the number of wires which can be placed per area unit therefore decreases, the integration of the application specific semiconductor integrated circuit decreases.

BRIEF SUMMARY OF THE INVENTION

An application specific semiconductor integrated circuit related to an embodiment of the present invention having: a first wire which extends in a first direction and a second wire which extends in a parallel direction to this first wire and both of which are placed on a first wire layer, and a third wire which extends above the first wire and the second wire in a second direction which is perpendicular to intersects the first direction and which passing through a first via-hole is connected to the first wire, a fourth wire which is separated from the third wire, and a fifth wire which is separated in the smallest space from and in between the third wire and the fourth wire, extends in parallel and passing through a second via-hole is connected to the second wire, wherein one end of the fifth wire extends to the center between the first wire and the second wire from above the second wire.

A manufacturing method of an application specific semiconductor integrated circuit relating an embodiment of the present invention having: making a floor plan, placing a plurality of circuits based on the floor plan using an automatic placement and routing system, automatically placing a plurality of via-holes which connect a plurality of wires which connect the circuits and upper and lower wires based on a contact zero margin rule using an automatic placement and routing system, performing an overlay margin error check and extracting the required space for the placement of a contact overlay margin around the via-hole of a wire, extending one end of another wire to the side of a via-hole of a wire when another adjacent wire exists in the smallest space in the wire which is the required space for the placement of a contact overlay margin, and placing the contact overlay margin around the via-hole of a wire when another adjacent wire does not exist in the smallest space in the wire which is the required space for the placement of a contact overlay margin.

DETAILED DESCRIPTION OF THE INVENTION

Figure 1A:
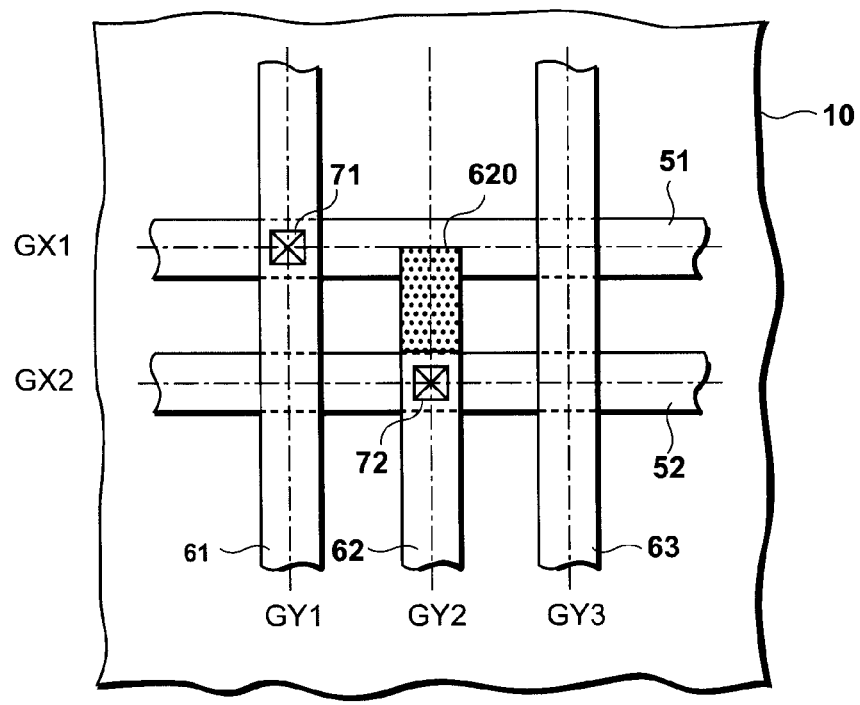
FIG. 1 (A) and FIG. 1 (B) are enlarged plane views of the substantial part of an application specific semiconductor integrated circuit relating to a first embodiment of the present invention.

Below, the embodiments of the present invention will be explained in detail while referring to the drawings. The present embodiment explains an example which applies the present invention to an application specific semiconductor integrated circuit and its manufacturing methods. Here, the application specific semiconductor integrated circuit means a semiconductor device which is manufactured by a manufacture process in which a process whereby at least the placement of a wire and the placement of a via-hole is automatically conducted by an automatic placement and routing system using a computer. Therefore, in a broad sense, the meaning of the application specific semiconductor integrated circuit includes a semiconductor integrated circuit manufactured using at least a mater slice method, a gate array method and a standard cell method. Also, functions which mix logic and memory are mounted on the application specific semiconductor integrated circuit.

First Embodiment

First embodiment of the present invention explains an example whereby the present invention is applied to the application specific semiconductor integrated circuit which is mounted with a logic function.

[Plane Layout of the Application Specific Semiconductor Integrated Circuit]

Figure 2:
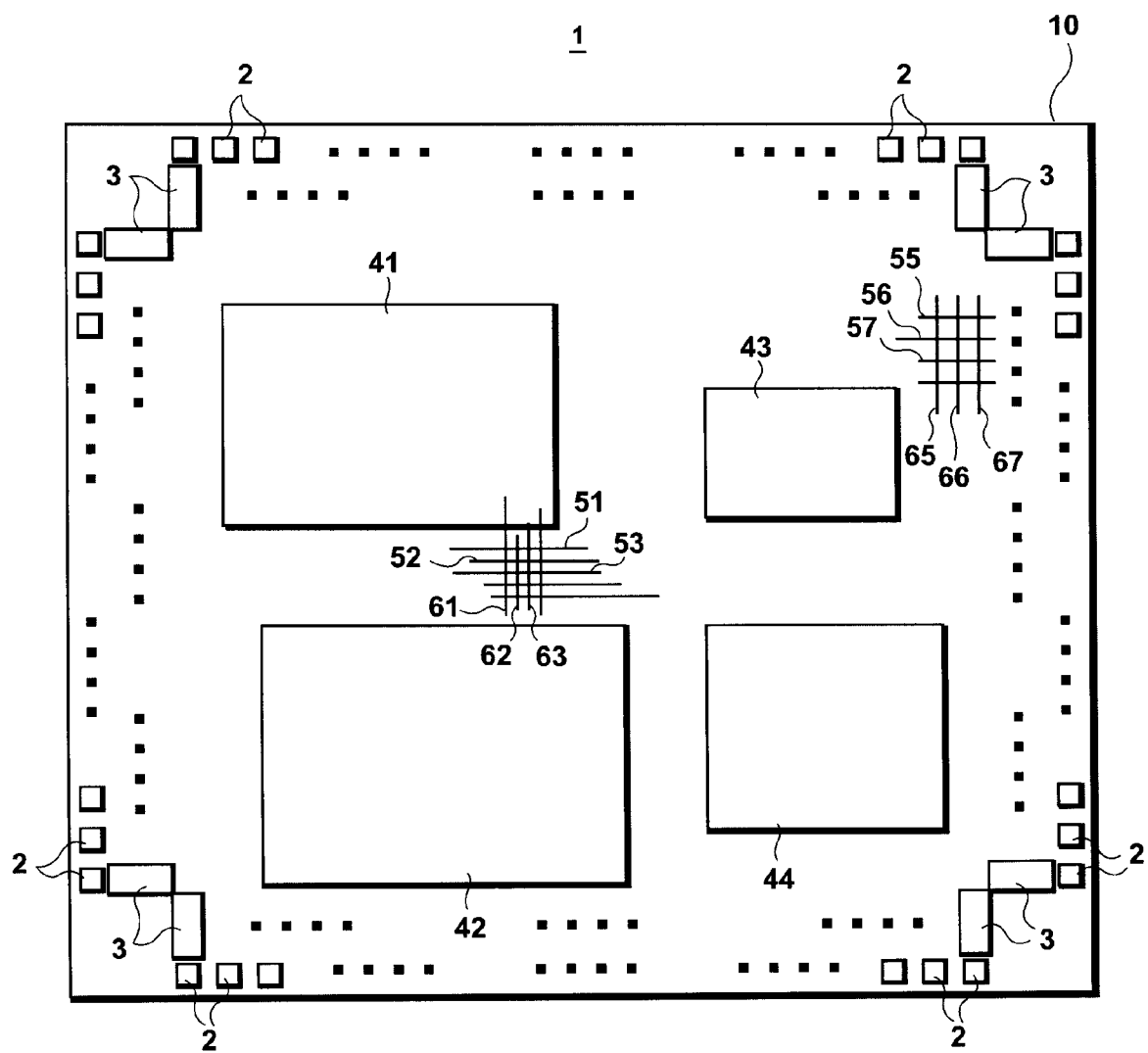
FIG. 2 is a plane layout view of the application specific semiconductor integrated circuit shown in FIG. 1.

As is shown in FIG. 2, the application specific semiconductor integrated circuit (ASIC) 1 relating to the present embodiment is arranged with external terminals (bonding pad) 2 which are arranged in series in the surrounding area alongside each area on a semiconductor substrate 10 which has a rectangular plane shape, interfaces 3 which are arranged corresponding to these external terminals 2, circuits 41 to 44 (function blocks) which are arranged within the area which is enclosed by the interfaces 3 and a plurality of wires 51, 52, 53, . . . , 55. 56, 57, . . . , 61, 62, 63, . . . , 65, 66, 67, . . . which connect these circuits 41 to 44.

It is possible to practically use a silicon single crystal substrate, for example, in the semiconductor substrate 10. The external terminals 2 are terminals which are electrically connect the interface 3 of the application specific semiconductor integrated circuit 1 and an external device of the application specific semiconductor integrated circuit 1. The interface 3 conducts an adjustment of a high level voltage and a signal which is input to the circuit 41 etc from an external device and or conducts an adjustment of a high level voltage and a signal which is output to an external device from the circuit 41.

The circuits 41 to 44 are, for example, logic circuits such as CPU, MPU and memory circuits such as ROM, RAM. Firstly, in the manufacturing process stage, the circuits 41 to 44 are automatically placed in the optimum position in a memory space above an automatic placement and routing system which uses a computer based on a floor plan. A mask for use in production is made based upon data which is created in this automatic placement and routing system and by actually carrying out a production process using this mask for use in production it is possible to make the circuits 41 to 44 above the semiconductor substrate 10. Each logic (circuit) and memory (circuit) are function blocks (part tools) which are opportunely designed in advance and it is possible to use these function blocks in the automatic placement and routing system.

In the application specific semiconductor integrated circuit 1 relating to first embodiment, a multi layer wire construction is adopted in the electrical connection of the external terminals 2, the interfaces 3 and the circuits 41 to 44 respectively. In order to simplify the explanation, an example with a two layer wire construction will be explained. Further, the present invention is not limited to a two layer wire construction and it is possible to apply it (the present invention) to a multi layer wire construction of three layers or more.

Each of the wires 51, 52, 53, . . . , 55, 56, 57, . . . are the wires (lower layer wires) of a first layer which is placed on a first layer wire layer. Each of the wires 61, 62, 63, . . . , 65, 66, 67, . . . are wires (upper layer wires) of a second layer which is placed on a second layer wire layer a layer above the first layer wire layer. The wires of the first layer and the wires of the second layer are all, for example, formed from an aluminum alloy which is added with silicon (Si) which prevents alloy spike, or copper (Cu) which prevents electro-migration, into a main body. The aluminum ally is the main body means that a main body in which a current flows is an aluminum alloy. Therefore, as well as including a single layer aluminum alloy layer in these wires 51, 61, etc a compound layer is included of a barrier metal layer, an aluminum alloy layer and a reflective prevention layer layered in order respectively.

In the application specific semiconductor integrated circuit 1, the wires 51, 52, 53 etc in FIG. 2 which are placed on the first layer wire layer, are extended in a horizontal direction (first direction) and are arranged in series in a vertical direction (second direction) having the smallest space (between them) while the wires 55, 56, 57 etc are arranged with a space (between them) which is more than the smallest space. For example, a smallest series pitch is made a size which adds a smallest size to the smallest wire width and the wires 51 etc are arranged in series in this smallest size pitch. The actual smallest series pitch becomes a size where a wire width which is half the wire which has the smallest wire width is added to a smallest space and half the wire width of another wire which has the smallest width and is adjacent to a wire which lies between this smallest space. The series pitch is equivalent to a wire grid interval on the automatic placement and routing system. The wires 51 etc, are arranged in series, for example, in integer multiples of the smallest series pitch. Here, the smallest wire width is used to mean the smallest wire width size which can be processed in a manufacturing process on the first layer wire layer. Also, the smallest space is used to mean the smallest separation interval between wires that can be processed in a manufacturing process on the first layer wire layer. The wires 61, 62, 63, etc which are placed on the second layer wire layer are extended in a vertical direction and are arranged in series in a horizontal direction having the smallest space (between them) while the wires 65, 66, 67 etc are arranged with a space (between them) which is more than the smallest space. Similarly, for example, the wires 61 etc are arranged in series in integer multiples of the smallest series pitch. Here, the smallest series pitch is used to mean the same as the smallest series pitch stated above.

Because a wire is automatically placed using an algorithm of the automatic placement and routing system so that the best conditions are met in the application specific semiconductor integrated circuit 1, the wire density in the center of the application specific semiconductor integrated circuit 1 becomes high and the wire density in the around of the application specific semiconductor integrated circuit 1 becomes low. The wires 51, 52, 53 of the first layer wire layer and the wires 61, 62, 63 of the second layer wire layer are placed in an area with a high wire density and the wires 51 and 52, the wires 52 and 53, the wires 61 and 62 and the wires 62 and 63 etc are arranged in series with the smallest space between them. Alternatively, the wires 55, 56, 57 of the second layer wire layer and the wires 65, 66, 67 of the second layer wire layer are placed in an area with a low wire density and the wires 55 and 56, the wires 56 and 57, the wires 65 and 66 and the wires 66 and 67 etc are arranged in series so that the space between them is a multiple integer of more than twice the smallest space.

[Detailed Plane View of a Wire Layout]

Figure 1B:
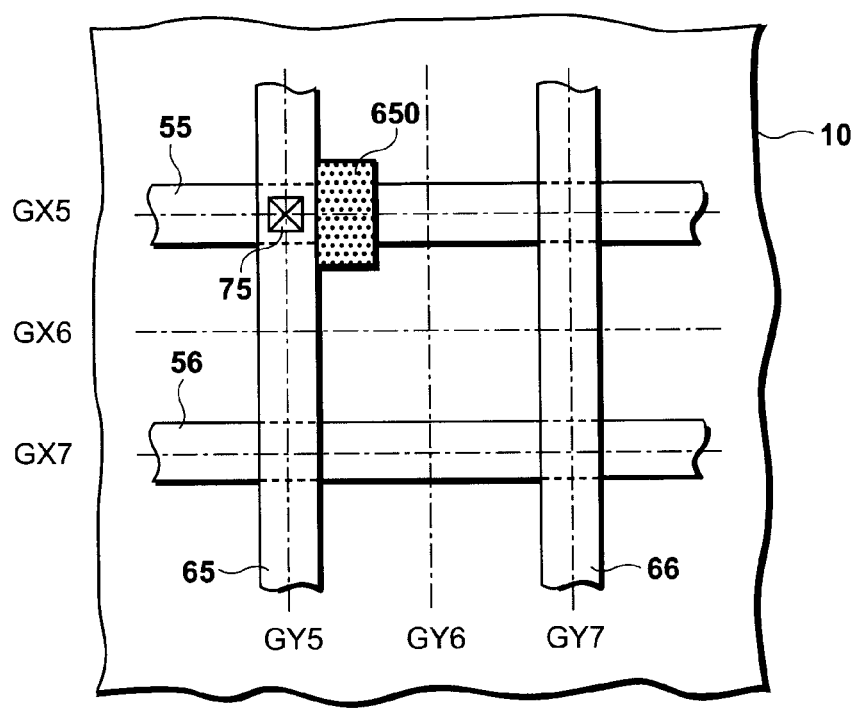

As is shown in FIG. 1 (A), the application specific semiconductor integrated circuit 1 relating to the first embodiment, in the area wire density is high, is arranged with a wire 51 (first wire) which is placed on the first layer wire and extends in a horizontal direction and a wire 52 (second wire) which extends in a parallel direction to the wire 51, a wire 61 (third wire) which is placed on the second layer wire layer and extends in a vertical direction above the wire 51 and the wire 52 and which passes through a via-hole 71 (a first through-hole or a first via-hole) and which is connected to the wire 51, a wire 63 (fourth wire) which is separated from wire 61 and extends in a parallel direction above the wire 51 and the wire 52 and a wire 62 (fifth wire) which is separated from both the wire 61 and the wire 63 and which extends in a parallel direction in the smallest space and is connected to the wire 52 by passing through a via-hole 72 (second via-hole). And, one end (an extension division) 620 of the wire 62, as represented by a dot pattern in the same drawing, extends at least as far as the center between the wire 52 and the wire 51 from above the wire 52.

Here, a plane view of the manufactured application specific semiconductor integrated circuit 1 is shown as an actual product, however, in the automatic placement and routing system, a possible placement grid of a wire is shown by overlapping GY and GX. In other words, the wire 51 extends above the grid GX1, the wire 52 extends to the center of the above the grid GX2, the wire 61 extends above the grid GY1, the wire 62 extends above the grid GY2 and the wire 63 extends above the grid GY3 to the center of the application specific semiconductor integrated circuit 1. The grid space GX within the first layer wire layer and the grid space GY within the second layer wire layer is equivalent to the smallest wire interval (wire pitch) and a wire is not placed within the grid GX as well as the grid GY.

In the first embodiment, the end 620 of the wire 62 extends to a central position above the wire 51. Conventionally, when the end 620 of the wire 62 is extended above the wire 51, a via-hole is placed in this overlapping area, however, the via-hole is not placed here. In other words, the extended end 620 of the wire 62 is extended as far as the proximity of the via-hole 71 of the wire 61 and corresponds to a contact overlay margin which should be arranged on this wire 61, and is used as a dummy wire which controls/reduces the variation in the dimension of a wire width which is caused by the level of wire density in the manufacture process. Further, it is possible to extend the end 620 of the wire 62 as far as the edge face of the wire 51 or as far as the area where a contact overlay margin. And end 620 stretches on grid. GY2.

On the other hand, the application specific semiconductor integrated circuit 1, as shown in FIG. 1 (B), in the area where wire density is low, is arranged with a wire 55 (sixth wire) which is placed on the first layer wire and extends in a horizontal direction and a wire 56 (seventh wire) which extends in a parallel direction to the wire 55, a wire 65 (eighth wire) which is placed on the second layer wire layer and extends in a vertical direction above the wire 55 and the wire 56 and which passes through a via-hole 75 (a third through-hole or a first via-hole) and which is connected to the wire 55, a wire 66 (ninth wire) which is separated from wire 65 and extends in a parallel direction above the wire 55 and the wire 56 in a space more than the smallest space. In the proximity of the via-hole 75 a contact overlay margin 650 is arranged on the wire 66 side of the wire 65, as is represented by the dot pattern in the same drawing.

As previously stated, the wire 55 extends above the grid GX5, the wire 56 extends above the grid GX7, the wire 65 extends above the grid GY5 and the wire 66 extends above the grid GY7. A wire is not placed above the grids GX6 and GY6. When a wire exists in the smallest space above the grid GY6 which is adjacent to the wire 65 which extends above the grid GY5, because the design rules are not satisfied a contact overlay margin 650 cannot be arranged.

That is, in the application specific semiconductor integrated circuit 1 relating to the present embodiment, the area where wire density is highs a smallest space continues to be maintained, the end 620 of the wire 62 is extended and a dummy wire which corresponds to a contact overlay margin is arranged and in the area where wire density is low, because there is plenty of room between wires a contact overlay margin 650 is arranged. In FIG. 1 (A) and FIG. 2 (B), a wire pattern is shown of the main back of the application specific semiconductor integrated circuit 1 which is a finished product when the manufacture process is finished, however, in the creation of this type of wire pattern an automatic placement and routing system is used.

[Manufacturing Methods of the Application Specific Semiconductor Integrated Circuit]

Figure 3:
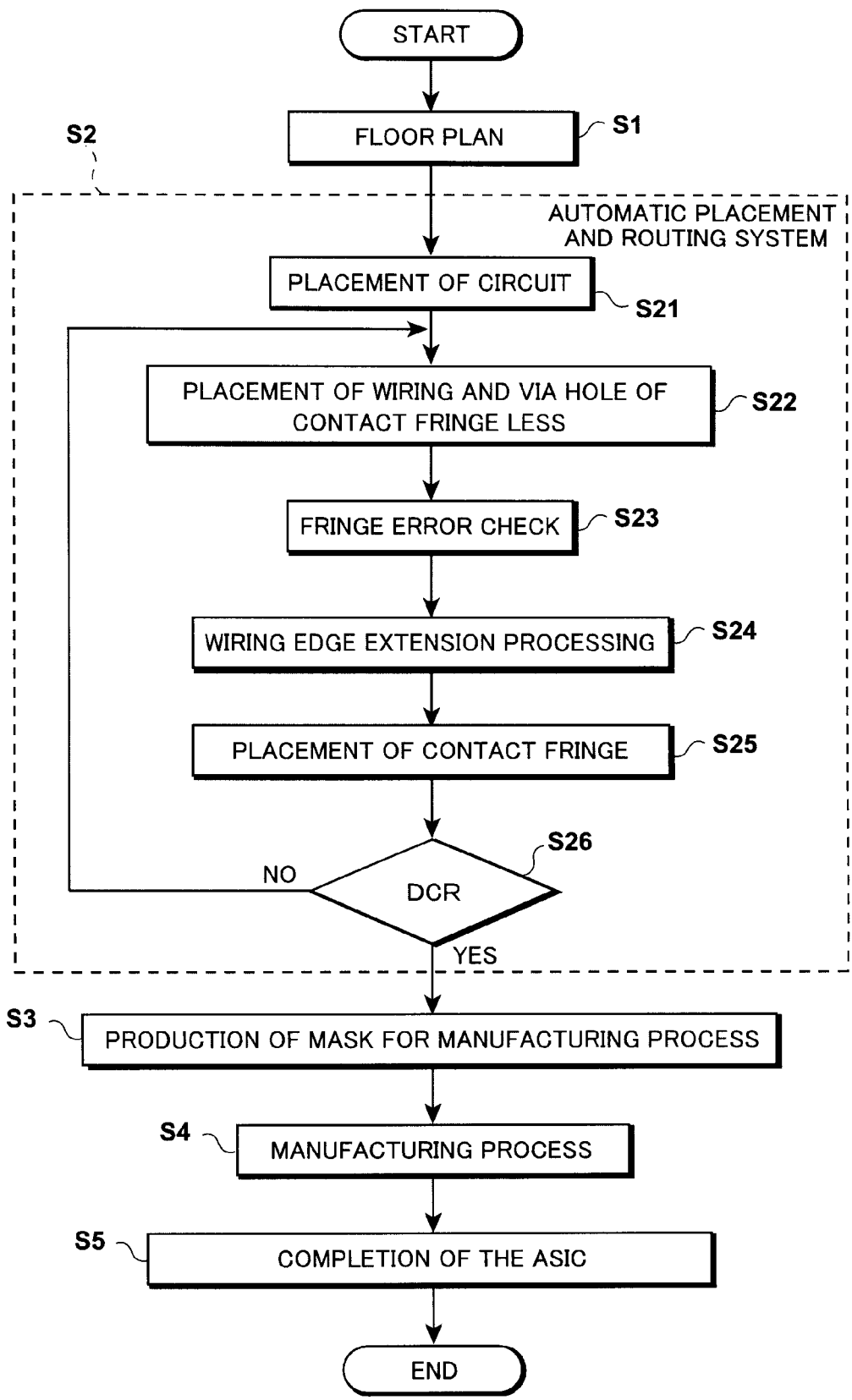
FIG. 3 is a flowchart which explains the manufacturing method of the application specific semiconductor integrated circuit shown in FIG. 1.

Next, the manufacturing methods of the previously stated application specific semiconductor integrated circuit 1 will be explained referring to the previously stated FIG. 1 (A), FIG. 1 (B) and FIG. 2 and using FIG. 3.

First, the entire floor plan of the application specific semiconductor integrated circuit 1 to be constructed is made (step S1. Below, shown simply as (S1)). In this floor plan, the logic circuits and memory circuits which are to be mounted are decided, the design rules for the wires and power supply wires are decided and the final physical realization of the circuit is confirmed.

Based on this type of process, in the automatic placement and routing system (S2) which uses a computer, an external terminal 2, an interface 3 and circuits 41 to 44 are each automatically placed in an opportune position (S21) above a semiconductor substrate 10 which is prepared in a memory space.

Similarly, in the automatic placement and routing system in accordance with the design rules of a zero margin contact, as well as automatically placing the wires which connect the circuits 41 to 44 by an algorithm, a via-hole is placed at the connection points between the upper and lower wires (a connection point between a first layer wire and a second layer wire) (S22). The connection between the external terminal 2 and the interface 3, the connection among the semiconductor elements within the interface 3 and the connection among the semiconductor elements within the circuits 41 to 44 are included in the placement of the wires here. Also, the design rule of the zero margin contact is a rule which does not place a contact overlay margin around the via-hole of a wire and thus maintains uniformity of a wire width. In other words, an interval between the grid GX and the grid GY shown in the previously stated FIG. 1 (A) and FIG. 1 (B) is fixed and it is possible to realize a smallest space in the wire interval of the application specific semiconductor integrated circuit 1 completed as an actual product.

Next, an overlay margin error check is performed and a place where the placement of a contact overlay margin around the via-hole of a wire is required is extracted (S23). Here, the required place for a contact overlay margin placement is the area where it is necessary to correct the phenomenon whereby the wire width dimensions are reduced because the separation dimension between a wire where a via-hole is placed and an adjacent wire, for example, an area where a space exists which is larger than the smallest space and during the manufacture of a wire during the manufacture process the developing solution or etching solution sufficiently wrap-around. For example, the place where a contact overlay margin placement is required is focused on areas which have a space twice or bigger or a smallest series pitch twice or bigger than the smallest space.

Based on the result which is extracted by the overlay margin error check, the place where the contact overlay margin is originally required, when another adjacent wire exists in the smallest space of a wire (particularly, an area where the wire density is high) in other words, as is shown in the previously stated FIG. 1 (A), when the wire 62 exists between the wire 61 and the wire 63 a correction is performed to extend the end 620 of this wire 62 as far as the proximity of the via-hole 71 of the wire 61 (S24). This extension correction is the correction of the wire data of the automatic placement and routing system and can be performed automatically by a program or can be performed manually.

Next, based on the result which is extracted by the overlay margin error check, the place where the contact overlay margin is originally required, when another adjacent wire exists in the smallest space of a wire (particularly, an area where the wire density is low) in other words, as is shown in the previously stated FIG. 1 (B), when a wire does not exist between the wire 65 and the wire 66 a correction is performed to place the contact overlay margin 650 around the via-hole 75 of the wire 65 (S25). This extension correction is the correction of the wire data of the automatic placement and routing system and can be performed automatically by a program or can be performed manually.

Next, a design rule check (DRC) is performed (S26) to find whether a breach of the design rules has occurred. In the case of a breach, the placement of the wire is performed again according to the design rules of the zero margin contact. Also, an extension correction of the place where the design rule is breached or a placement correction of the contact overlay margin is performed again.

Next, in this kind of automatic placement and routing system, based on the placement data of the external terminal 2, placement data of the interface 3, placement data of the circuits 41 to 44 and the placement data of the wire 51 etc which performs an extension correction or a placement correction of the contact overlay margin 650, a mask for use in the manufacturing process is produced (S3). The production of this mask for use in the manufacturing process means programming a pattern using an electron beam depiction device on a mask blanks and manufacturing a reticule (or a master mask).

Using a mask for use in manufacturing, by conducting a semiconductor manufacturing process on an actual semiconductor substrate 10 it is possible to manufacture an application specific semiconductor integrated circuit 1 and complete it as a product.

As explained above, in the application specific semiconductor integrated circuit 1 relating to the first embodiment, the contact overlay margin is a required place, the end 620 of the wire 62 is extended and because a dummy wire which functions as a contact overlay margin is arranged in the area where wire density is high, it is possible to maintain a wire interval at a smallest space, increase the number of wires per area unit and improve the level of integration.

Furthermore, in the manufacturing method of the application specific semiconductor integrated circuit 1 relating to the first embodiment, after placing a wire based on the design rules of a zero margin contact, the end 620 of the wire 62 is extended in the area where wire density is high and because the contact overlay margin 650 is placed in the area where wire density is low, the fluctuation in wire width in the manufacture process continues to be reduced and it is possible to increase the number of wires per area unit.

Second Embodiment

The second embodiment of the present invention explains an example whereby the present invention is applied to a simple NAND type flash memory which is best suited to large memory capacity as a non-volatile memory or a semiconductor integrated circuit which is mounted with this NAND flash memory.

[A Plane Layout and System Construction of the Application Specific Semiconductor Integrated Circuit]

Figure 4:
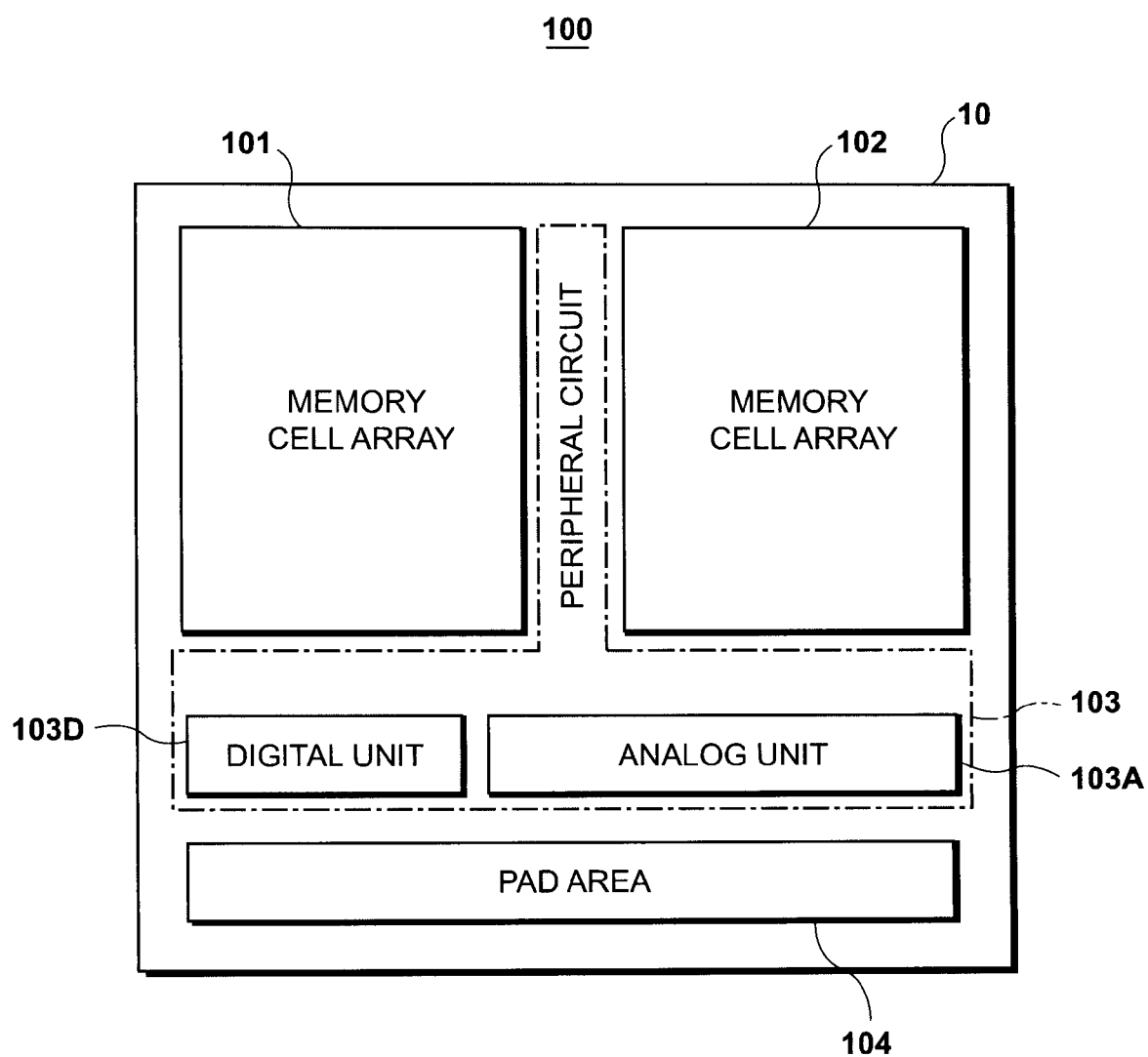
FIG. 4 is a plane layout view of the application specific semiconductor integrated circuit (a NAND type flash memory) relating to a second embodiment of the present invention.

As is shown in FIG. 4, the application specific semiconductor integrated circuit 100 relating to the second embodiment of the present invention is mounted with a NAND type flash memory on a semiconductor substrate 10. This NAND type flash memory is arranged with a memory cell array 101 and 102, a peripheral circuit 103 and a pad area 104.

Although not shown in the drawings, in the memory cell array 101 and 102, a data line and a word line intersect and are arranged in series. A plurality of memory units are arranged in series in the direction of an extended data line and the direction of an extended word line in a matrix shape. The memory unit is arranged with a memory string which electrically connects a plurality of memory cells in a series, a drain side selection transistor which is electrically connected in series to one end of this memory string and a source side selection transistor which is electrically connected to the other end of the memory string. A data line is electrically connected to the drain side selection transistor of the memory string and a source line is electrically connected to the source side selection transistor. A word line is electrically connected to each memory cell of the memory string. A memory cell is constructed from, for example, an IGFET (insulated gate type field effect transistor) having a charge accumulation region.

Figure 5:
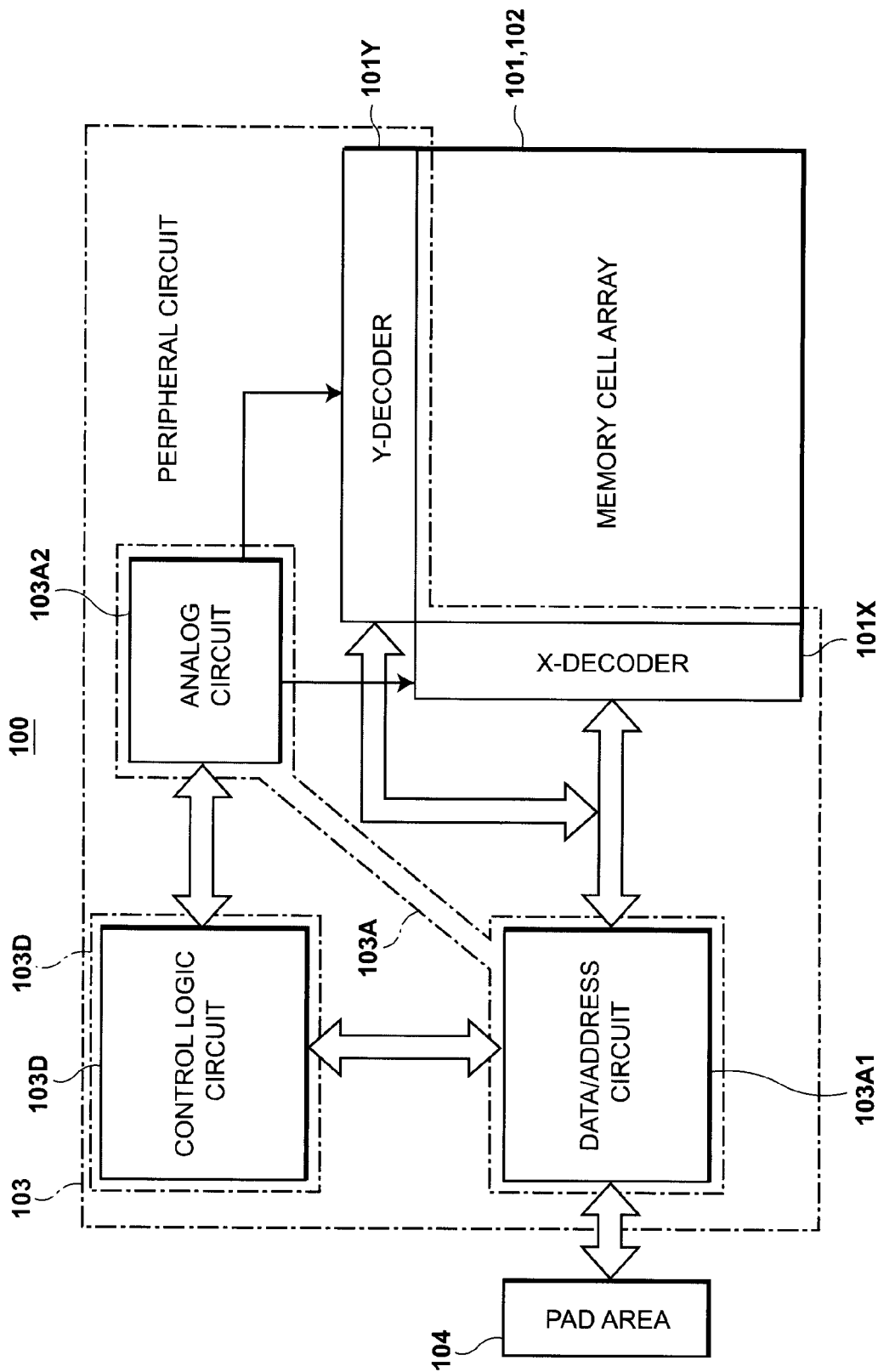
FIG. 5 is a circuit diagram of the application specific semiconductor integrated circuit shown in FIG. 4.

As is shown in FIG. 5, an X decoder 101X and a Y decoder 101Y are each placed on the periphery of the memory cell array 101 and 102. A word line which is extended to the memory cell array 101 and 102 is electrically connected to the X decoder 101X and this word line is selected by the X decoder 101X. A data line which is extended to the memory cell array 101 and 102 is electrically connected to the Y decoder 101Y and this data line is selected by the Y decoder 101Y. The X decoder 101X and the Y decoder 101Y both construct the periphery circuits.

Further, as is shown in FIG. 4, the periphery circuits 103 are arranged with an analog unit 103A and a digital unit 103D. As is shown in FIG. 5, the analog unit 103A includes a data/address circuit 103A1 and an analog circuit 103A2. The analog circuit 103A2 includes a charge pump and a regulator etc. As is shown in FIG. 5 the digital unit 103D includes a control logic circuit 103D in the second embodiment. The function of this control logic circuit 103D can be changed according to the specifications of the NAND type flash memory. That is, in the manufacturing process of a control logic circuit 103D1 of the application specific semiconductor integrated circuit 100, an automatic placement and routing system is used the same as the manufacturing method of the application specific semiconductor integrated circuit 1 relating to the previously stated first embodiment. A logic circuit such as a NAND gate circuit, a AND gate circuit or a NOR gate circuit are placed by this automatic placement and routing system, and these logic circuits are electrically connected. Further, in the control logic circuit 103D1, in the area where wire density is high one end of a wire is extended and in the area where wire density is low an overlay margin is created.

In the application specific semiconductor integrated circuit 100 relating the second embodiment it is possible to obtain the same effects as the effects obtained in the application specific semiconductor integrated circuit 1 relating to the first embodiment. Further, in the digital unit 103D of the application specific semiconductor integrated circuit 100, in particular in the control logic circuit 103D1, because the speed of the circuit operation is not demanded it is possible to apply minimum design rules and improve integration. Also, in the analog unit 103A of the application specific semiconductor integrated circuit 100, in order to fulfill the interface specifications of an analog signal, a minimum design rule is not applied. Further, the application specific semiconductor integrated circuit 100 relating to the second embodiment is not limited to a NAND flash memory, a NOR type flash memory, DRAM (dynamic random access memory) or an SRAM (static random access memory) etc can also be mounted.

Other Embodiments

Further, the present invention is not limited to the previously stated embodiments. For example, the present invention can be applied also in the case of placing a wire on a wire substrate, a liquid crystal glass substrate or an insulation substrate etc by an automatic placement and routing system which uses a computer.

As was explained above, according to the present invention, it is possible to increase the number of wires per area unit and propose an application specific semiconductor integrated circuit which can improve integration.

Further, according to the present invention, the fluctuation in wire width in the manufacture process continues to be reduced and it is possible to propose an application specific semiconductor integrated circuit which can increase the number of wires per area unit.

What is claimed is:

1. An application specific integrated circuit comprising:
a first wire which is extended in a first direction and a second wire which is extended in a parallel direction to this first wire and both of which are placed on a first wire layer; and
a third wire which is placed on a second wire layer above said first wire layer and is extended above said first wire and above said second wire in a second direction which intersects to said first direction and passing through a first via-hole is connected to said first wire, and a fourth wire which is separated from said third wire and is extended in a parallel direction above said first wire and above said second wire and a fifth wire which is separated from both said third wire and said fourth wire and is extended in a parallel direction in a smallest space and passing through a second via-hole is connected to said second wire,
wherein one end of said fifth wire is extended to the center between said second wire and said first wire from above said second wire;
a sixth wire which is extended in a said first direction and placed on said first wire layer and a seventh wire which is extended in a parallel direction to this sixth wire;
an eighth wire which is placed on said second wire layer and is extended above said sixth wire and above said seventh wire and passing through a third via-hole is connected to said sixth wire, and a ninth wire which is separated from said eighth wire and is extended in a parallel direction in a space more than a smallest space above said sixth wire and above said seventh wire; and
a contact overlay margin which is placed on the said ninth wire side of said eight wire in the proximity of said third via-hole.

2. The application specific integrated circuit in claim 1, wherein one end of said fifth wire is extended as far as above said first wire and a via-hole is not placed between one end of this fifth wire and said first wire on a layer below.

3. The application specific integrated circuit in claim 2 further comprising;
a sixth wire which is extended in said first direction and placed on said first wire layer and a seventh wire which is extended in a parallel direction to this sixth wire;
an eighth wire which is placed on said second wire layer and is extended above said sixth wire and above said seventh wire and passing through a third via-hole is connected to said sixth wire, and a ninth wire which is separated from said eighth wire and is extended in a parallel direction in a space more than a smallest space above said sixth wire and above said second seventh; and
a contact overlay margin which is placed on the said ninth wire side of said eight wire in the proximity of said third via-hole.

4. The application specific integrated circuit in claim 2, wherein said eight wire and said ninth wire are separated by a space which is twice or more the size of the smallest space.

5. The application specific integrated circuit in claim 2 further comprising:
a memory cell array; and
a periphery circuit including an analog unit and a digital unit, wherein said first wire to said fifth wire are arranged in series in a area of said digital unit where wire density is high and said sixth wire to said ninth wire are arranged in series in a area of said digital unit where wire density is low.

6. The application specific integrated circuit in claim 5, wherein a control logic circuit is included in said analog unit.

7. The application specific integrated circuit in claim 5, wherein a charge pump and a regulator are included in said analog unit.

8. The application specific integrated circuit in claim 5, wherein a memory cell unit is arranged in a row shape in said memory cell array, and said memory unit includes a memory string which electrically connects a plurality of memory cells in a series and selection transistors which are electrically connected to one end and the other end respectively of a memory string in a series.

9. The application specific integrated circuit in claim 5 is a NAND type flash memory.

10. The application specific integrated circuit in claim 1, wherein said first wire, said second wire, said third wire, said fourth wire and said fifth wire are arranged in series in the central area above a semiconductor substrate.

11. The application specific integrated circuit in claim 10, wherein said sixth wire, said seventh wire, said eighth wire and said ninth wire are arranged in series in the area around the circumference on said semiconductor substrate.

12. The application specific integrated circuit in claim 1, wherein said first wire, said second wire, said third wire, said fourth wire and said fifth wire are arranged in series in a area on said semiconductor substrate where wire density is high and said sixth wire, said seventh wire, said eighth wire and said ninth wire are arranged in series in a area on said semiconductor substrate where wire density is low.

13. The application specific integrated circuit in claim 1 further comprising:
   a memory cell array; and
   a periphery circuit including an analog unit and a digital unit, wherein said first wire to said fifth wire are arranged in series in said digital unit.

* * * * *